(12) United States Patent
Artis

(10) Patent No.: US 9,894,803 B1
(45) Date of Patent: Feb. 13, 2018

(54) THERMAL SINK WITH AN EMBEDDED HEAT PIPE

(71) Applicant: Abaco Systems, Inc., Huntsville, AL (US)

(72) Inventor: Steven Daniel Artis, Madison, AL (US)

(73) Assignee: Abaco Systems, Inc., Huntsville, AL (US)

( * ) Notice: Subject to any disclaimer, the term of this patent is extended or adjusted under 35 U.S.C. 154(b) by 0 days.

(21) Appl. No.: 15/355,764

(22) Filed: Nov. 18, 2016

(51) Int. Cl.
*H01L 23/427* (2006.01)
*H01L 23/467* (2006.01)
(Continued)

(52) U.S. Cl.
CPC ........... *H05K 7/20336* (2013.01); *F28F 1/02* (2013.01); *F28F 1/04* (2013.01); *F28F 1/12* (2013.01);
(Continued)

(58) Field of Classification Search
CPC ......... H01L 2924/0002; H01L 2924/00; H01L 23/427; H01L 23/467; H01L 23/3672; H01L 23/473; H01L 23/367; H01L 23/3677; H01L 23/4006; H01L 23/4093; H01L 23/3675; H01L 35/32; F28D 15/0275; F28D 15/0266; F28D 15/0233; F28D 2021/0029; F28D 2015/0225; F28D 15/02; F28D 15/046; F28D 15/0283; F28D 2021/0031; F28D 15/00; F28D 2021/0028; G06F 1/20; G06F 1/203; G06F 2200/201; F28F 3/02; F28F 1/32; F28F 3/12; F28F 13/06; F28F 3/022; F28F 3/048; F28F 1/022; F28F 1/126; F28F 1/12; F28F 2250/08; F28F 1/40; F28F 2215/10; F28F 1/14; F28F 3/025; F28F 1/24; F28F 2215/04
See application file for complete search history.

(56) References Cited

U.S. PATENT DOCUMENTS 6,765,793 B2    7/2004  Kehret et al.
9,013,874 B2 *  4/2015  Kaldani .................. H05K 7/20
                                                165/104.33
(Continued)

FOREIGN PATENT DOCUMENTS

CN    101209006 A    6/2008
CN    101594768 B    11/2014
(Continued)

*Primary Examiner* — Adam B Dravininkas
(74) *Attorney, Agent, or Firm* — Meunier Carlin & Curfman LLC

(57) ABSTRACT

Heat sinks and thermal cooling systems are disclosed. The heat sinks and thermal cooling systems include fins, which extend away from a surface of a base of the heat sink, and which are located in a finned region on the surface. The heat sinks and thermal cooling systems also include one or more heat pipes that are positioned and shaped in a way so that a first portion of each heat pipe is in contact with the surface of the base, while at least a second portion of each heat pipe is raised above the surface of the base in into contact with fins in the finned region. Raising the heat pipes away from the surface of the base prevents components in contact with, or adjacent to, the base from being heated by the heat pipes.

20 Claims, 7 Drawing Sheets

(51) Int. Cl.

| | | |
|---|---|---|
| *H05K 7/20* | (2006.01) | |
| *F28F 1/04* | (2006.01) | |
| *H05K 1/02* | (2006.01) | |
| *F28F 1/02* | (2006.01) | |
| *F28F 1/12* | (2006.01) | |
| *F28F 21/08* | (2006.01) | |

(52) U.S. Cl.
 CPC .......... *F28F 21/084* (2013.01); *F28F 21/085* (2013.01); *H01L 23/427* (2013.01); *H01L 23/467* (2013.01); *H05K 1/0203* (2013.01); *H05K 7/20409* (2013.01); *F28F 2210/10* (2013.01)

(56) References Cited

U.S. PATENT DOCUMENTS

| | | | |
|---|---|---|---|
| 9,370,090 B2 | 6/2016 | Hoden et al. | |
| 2003/0189815 A1* | 10/2003 | Lee | H01L 23/427 |
| | | | 361/719 |
| 2004/0182552 A1* | 9/2004 | Kubo | H01L 23/3672 |
| | | | 165/104.33 |
| 2005/0073811 A1* | 4/2005 | Wang | F28D 15/0275 |
| | | | 361/688 |
| 2005/0257532 A1* | 11/2005 | Ikeda | F25B 21/02 |
| | | | 62/3.7 |
| 2007/0169919 A1* | 7/2007 | Deng | H01L 23/427 |
| | | | 165/104.33 |
| 2009/0154103 A1* | 6/2009 | Liu | H01L 23/427 |
| | | | 361/700 |
| 2011/0100604 A1* | 5/2011 | Anzai | B21D 53/08 |
| | | | 165/104.21 |
| 2011/0108237 A1* | 5/2011 | Kamath | H01L 23/4006 |
| | | | 165/80.3 |
| 2015/0327402 A1 | 11/2015 | Slippey et al. | |
| 2016/0169594 A1 | 6/2016 | Hoden et al. | |

FOREIGN PATENT DOCUMENTS

| | | |
|---|---|---|
| CN | 204087109 U | 1/2015 |
| CN | 205103739 U | 3/2016 |
| DE | 102009023113 A1 | 10/2010 |
| EP | 3027993 A1 | 6/2016 |
| JP | 2004028431 A | 1/2004 |
| JP | 2010245451 A | 10/2010 |

* cited by examiner

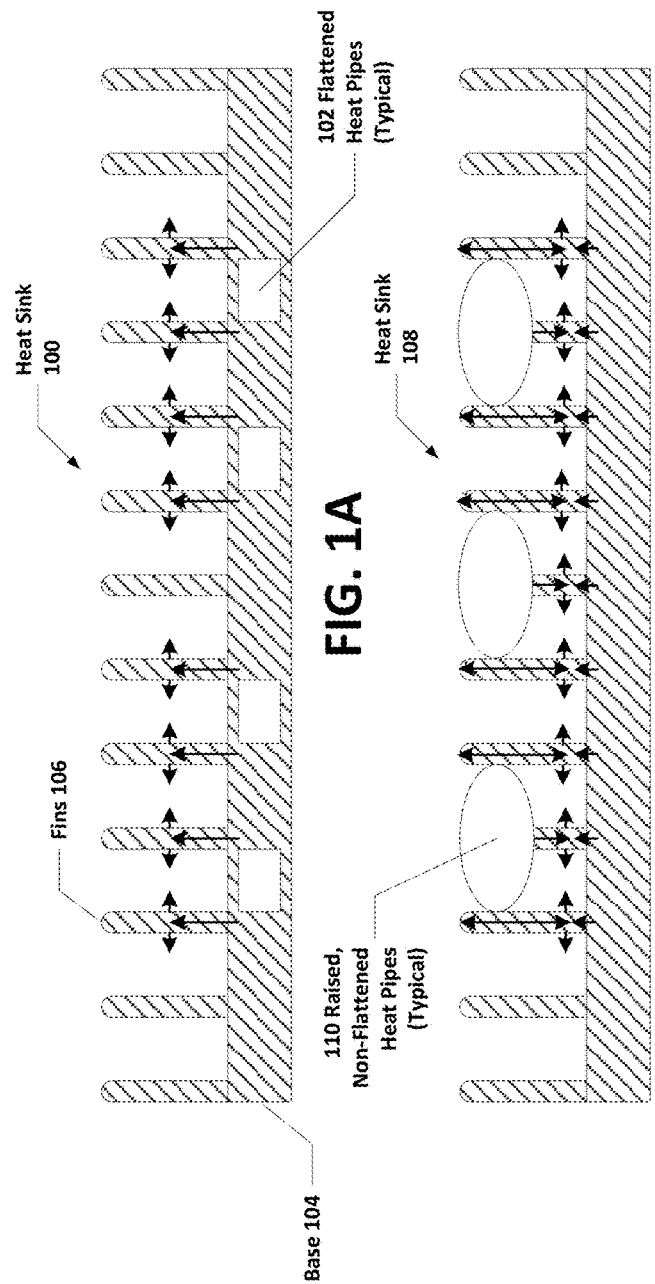

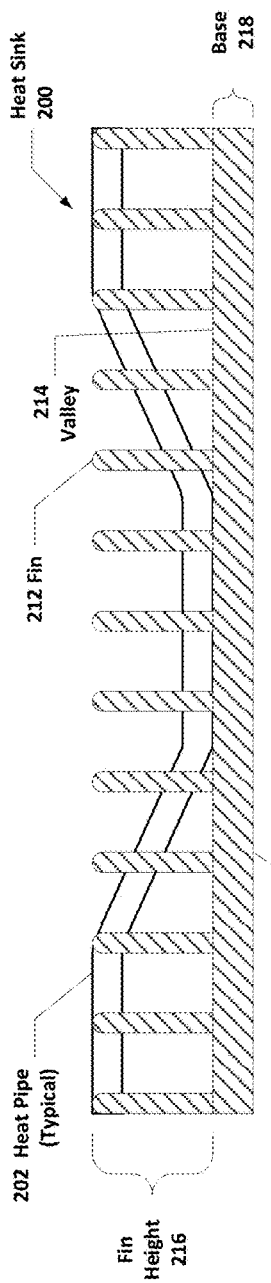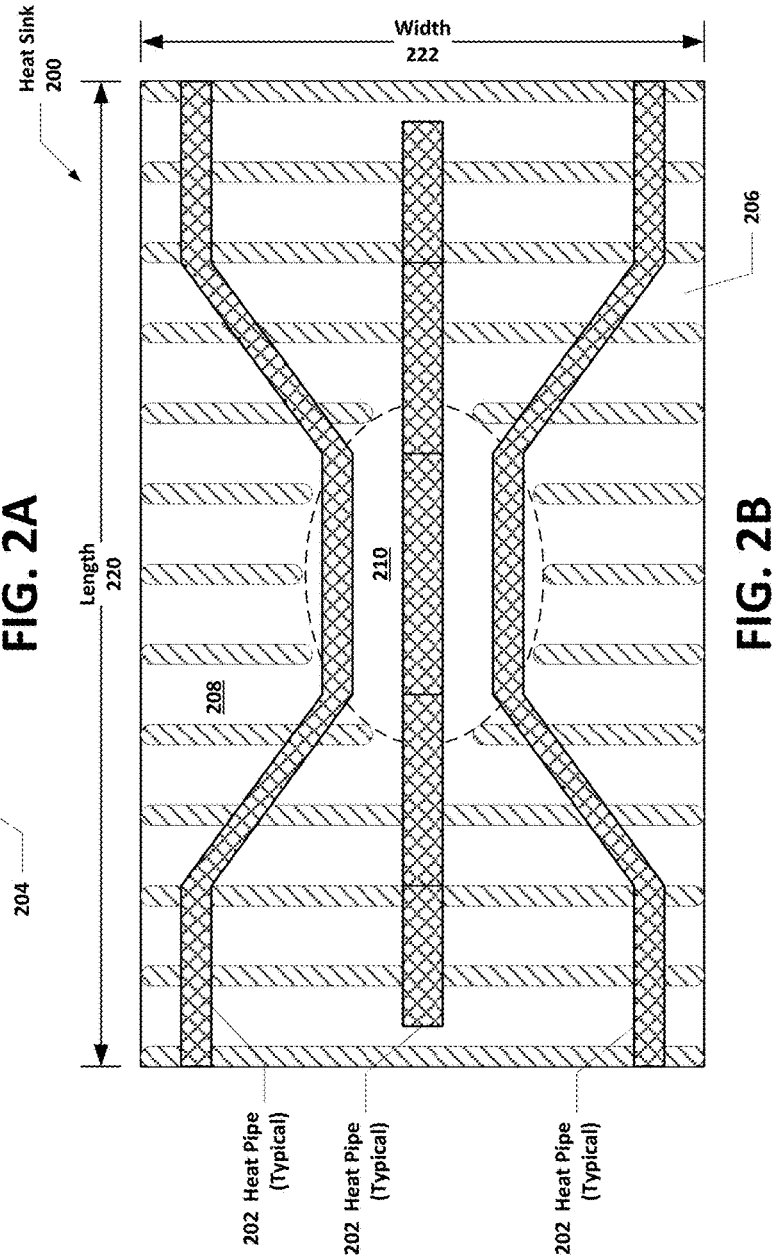

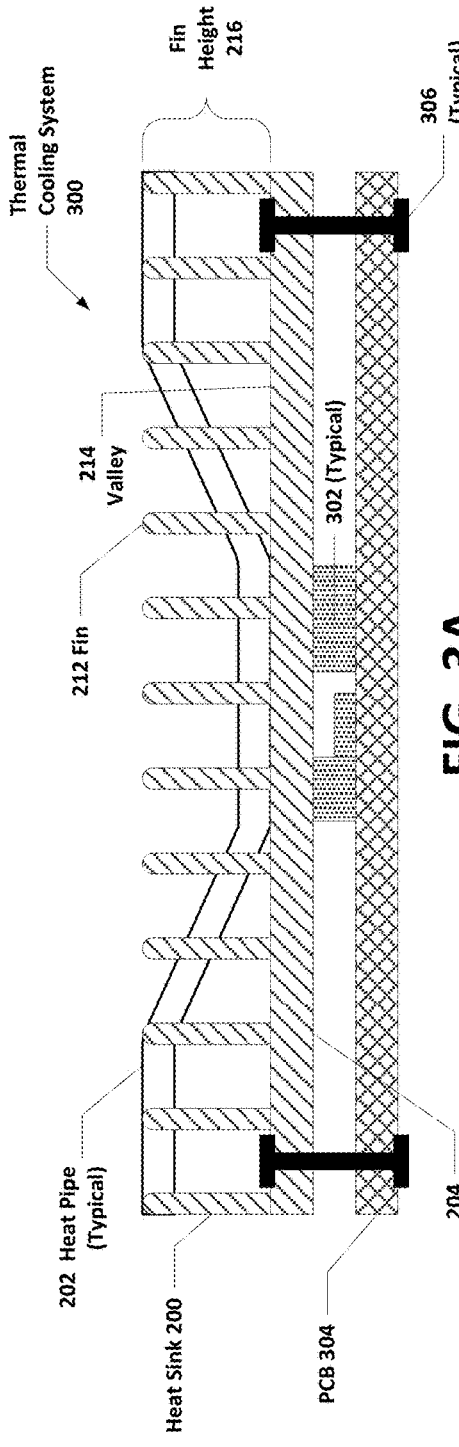
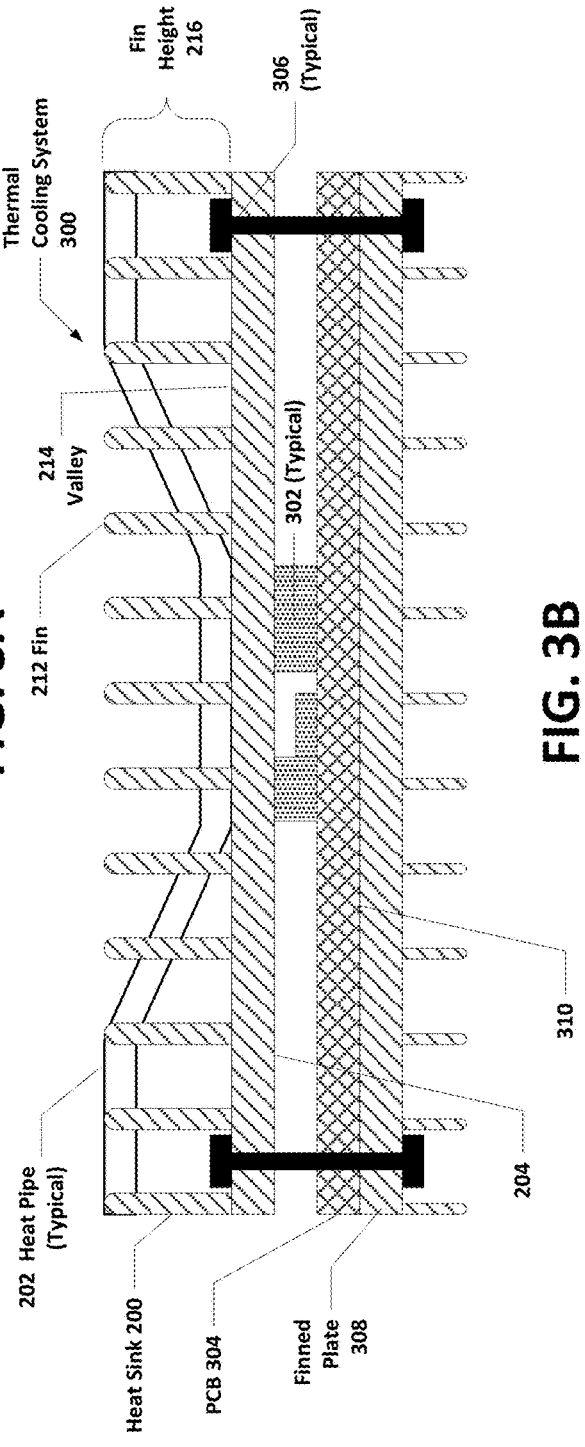
FIG. 3A
FIG. 3B

THERMAL SINK WITH AN EMBEDDED HEAT PIPE

TECHNICAL FIELD

Aspects of the disclosure relate generally to thermal cooling and in particular thermal cooling of electronic devices using a thermal sink comprising one or more embedded heat pipes.

BACKGROUND

Generally, heat sinks are used in a wide variety of applications to diffuse waste heat away from heat-producing components. For example, heat sinks may be used to keep electronic components at or below their maximum rated operating temperatures. Some conventional heat sinks have a base and a finned side. The base may have heat pipes or vapor chambers entirely embedded in the base. The challenge with heat pipes embedded in the base of a heat sink is the heat is able to diffuse out of the heat pipe along its entire length, heating components along the span.

Therefore, devices and systems desired that overcome challenges in the art, some of which are described above.

SUMMARY

Disclosed and described herein are heat sinks and thermal cooling systems that utilize raised heat pipes in the finned region of a heat sink to enhance heat transfer while minimizing heating of adjacent components. By raising the heat pipe into the finned area, the heat pipe only makes contact at the evaporator region, the fin cover, and the fins, preventing adjacent components from getting hot.

Disclosed herein are various embodiments of thermal sinks. One such thermal sink comprises a heat sink that is at least partially comprised of thermally-conductive material having one or more heat pipes embedded therein. The heat sink has a first side that can be placed in contact with or proximate to one or more heat-producing components and a second side opposite the first side. The second side has a finned region and a non-finned region with the finned region having fins thereon and valleys between the fins. Each of the fins has one or more heights. The one or more heat pipes each have a length. At least one of the one or more heat pipes has at least a first portion of its length in contact with the non-finned region of the second side and at least a second portion of its length is at least partially embedded in the one or more heights of the fins of the finned region. The second portion of the at least one heat pipe embedded in the one or more heights of the fins of the finned region is elevated away from the valleys between the fins.

The one or more heat pipes can have a cross-section geometry that includes circular, oval, square, rectangular, triangular, and the like.

The length of at least one of the one or more heat pipes can extend at least partially across a length of the heat sink, at least partially across a width of the heat sink, beyond a length of the heat sink, or beyond a width of the heat sink.

Alternatively or optionally, the second portion of the at least one heat pipe embedded in the one or more heights of the fins of the finned region can be in contact with one or more of the fins.

Alternatively or optionally, the heat sink may at least be partially comprised of aluminum 6101 or copper.

Alternatively or optionally, the first portion of at least one of the heat pipes may be at least partially embedded in the non-finned region of the heat sink.

Alternatively or optionally, the heat pipes embedded in the one or more heights of the fins of the finned region may be configured such that a top of each of the heat pipes is flush with or below a top of the fins.

Also disclosed herein are various embodiments of thermal cooling systems. One such thermal cooling system comprises a heat sink, wherein the heat sink is at least partially comprised of thermally-conductive material. The heat sink has a first side and a second side opposite the first side, the second side having a finned region and a non-finned region. The finned region has fins thereon and valleys between the fins, each fin having one or more heights. The heat sink further comprises one or more heat pipes each having a length, wherein at least one of the one or more heat pipes has at least a first portion of its length in contact with the non-finned region of the second side and at least a second portion of its length is at least partially embedded in the one or more heights of the fins of the finned region. The second portion of the at least one heat pipe embedded in the one or more heights of the fins of the finned region is elevated away from the valleys between the fins. The thermal cooling system may further comprise a primary plate that at least partially covers the fins of the heat sink and a printed circuit board (PCB) with one or more heat producing components thereon. The first side of the heat sink is in contact with or proximate to at least one of the one or more heat producing components of the PCB. The thermal cooling system may also include a finned plate in contact with or proximate to a second side of the PCB.

The one or more heat pipes of the thermal cooling systems can have a cross-section geometry that includes circular, oval, square, rectangular, triangular, and the like.

The length of at least one of the one or more heat pipes of the thermal cooling systems can extend at least partially across a length of the heat sink, at least partially across a width of the heat sink, beyond a length of the heat sink, or beyond a width of the heat sink.

Alternatively or optionally, the second portion of the at least one heat pipe embedded in the one or more heights of the fins of the finned region can be in contact with one or more of the fins.

Alternatively or optionally, the heat sink of the thermal cooling systems may at least be partially comprised of aluminum 6101 or copper.

Alternatively or optionally, the first portion of at least one of the heat pipes of the thermal cooling systems may be at least partially embedded in the non-finned region of the heat sink.

Alternatively or optionally, the heat pipes of the thermal cooling systems embedded in the one or more heights of the fins of the finned region may be configured such that a top of each of the heat pipes is flush with or below a top of the fins.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems:

FIG. 1A is an illustration of a prior art heat sink having flatten heat pipes embedded in its base;

FIG. 1B is an illustration of a heat sink having non-flattened heat pipes that are embedded in the fins of the heat sink and raised above the base of the heat sink;

FIG. 1C is the heat sink of FIG. 1B further comprising a primary plate that substantially covers the fins;

FIGS. 2A and 2B are an elevation or side view (FIG. 2A) and a plan or top view (FIG. 2B) of an embodiment of a heat sink having one or more embedded heat pipes;

FIGS. 3A, 3B and 3C illustrate side or elevation views of embodiments of a thermal cooling system that includes a heat sink;

DETAILED DESCRIPTION

Figure 2C:
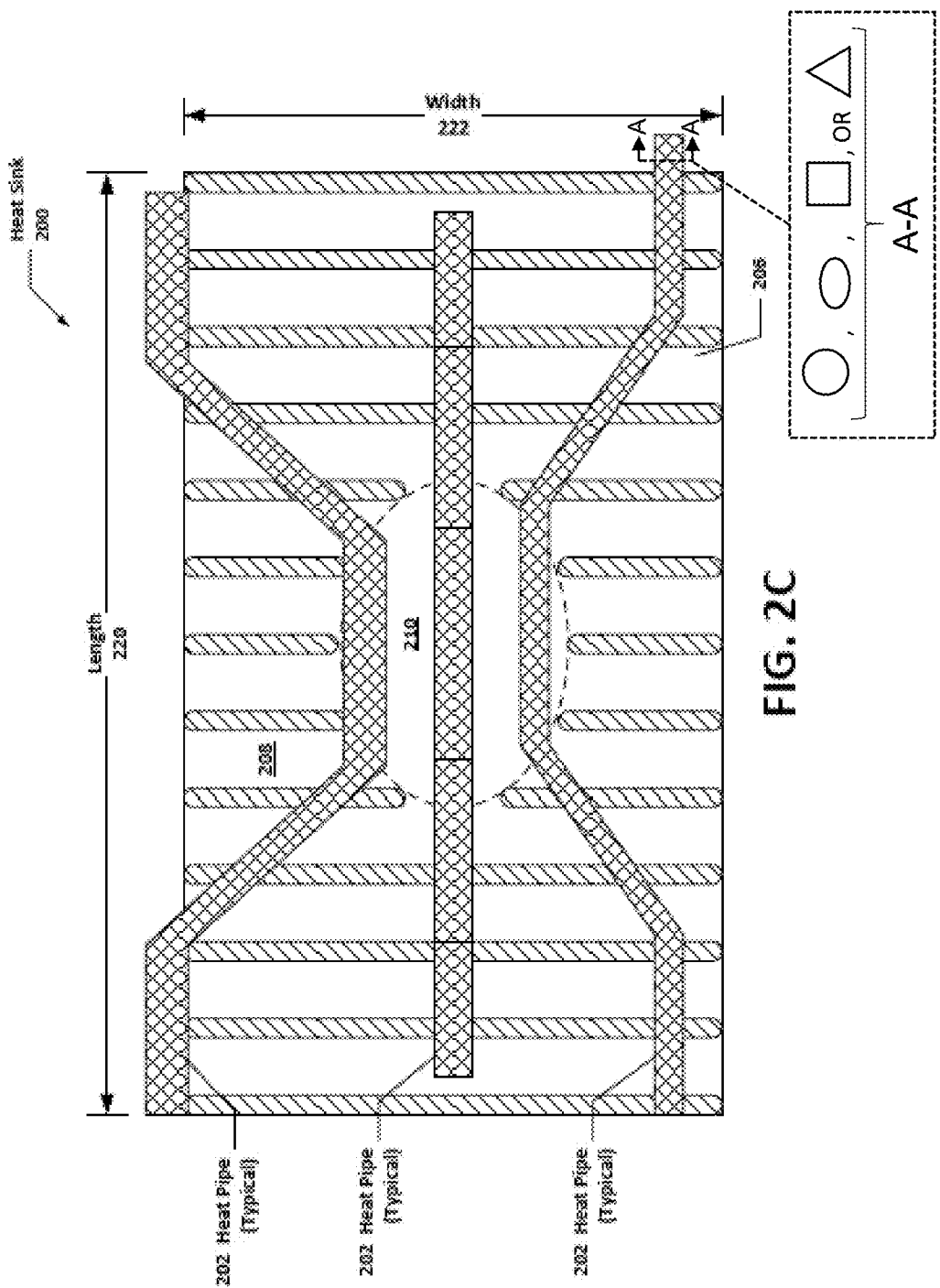
FIG. 2C is a plan or top view of an embodiment of a heat sink without a primary plate, the heat sink having one or more embedded heat pipes where at least one of the one or more heat pipes extends beyond the length of the heat sink and at least one of the one or more heat pipes extends beyond the width of the heat sink.

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Disclosed and described herein are heat sinks and thermal cooling systems that utilize raised heat pipes in the finned region of a heat sink to enhance heat transfer while minimizing heating of adjacent components. Advantages of this design include transporting heat to a preferred location for convection, enhancing cooling capabilities by providing a second path into the fins, reducing the risk that large hot spots pose to heat sensitive components, and the like.

Currently, as shown in FIG. 1A, flattened heat pipes 102 are embedded into the base 104 of a heat sink 100. As shown by the arrows in FIG. 1A that illustrate thermal conduction paths, heat sinks with base-embedded heat pipes 102 have reduced heat pipe 102 performance in flattened configuration (approximately 25% reduction in heat carrying capacity), cause heating of adjacent components, and do not make use of the top of fins 106 for cooling. As shown in FIG. 1B, embodiments of a heat sink 108 having raised, non-flattened heat-pipes 110 results in an enhanced thermal conduction path that minimizes heating of adjacent components, results in an ability to use non-flattened heat pipes (regain the approximately 25% lost performance caused by flattened heat pipes), enhances heat transfer into the finned region, and expands material options for the heat sink. Furthermore, if a primary plate or cover 112 is used (FIG. 1C), there is enhanced thermal diffusivity into the top cover 112.

FIGS. 2A and 2B are an elevation or side view (FIG. 2A) and a plan or top view (FIG. 2B) of an embodiment of a heat sink 200 having one or more embedded heat pipes 202. As used herein, "heat pipe" refers to a heat-transfer device provides both thermal conductivity and phase transition to regulate the transfer of heat between two solid interfaces, as known by one of ordinary skill in the art. Generally, the heat sink 200 is at least partially comprised of thermally-conductive materials such as copper and/or aluminum. In one specific embodiment, the heat sink 200 is comprised of aluminum 6101. The heat sink 200 has a first side 204 that can be placed in contact with or proximate to one or more heat-producing components (not shown in FIGS. 2A and 2B). This first side 204 of the heat sink 200 may be flat or smooth, or it may be milled or otherwise offset to accommodate the heat producing components and the size and/or shape of any board on which the components are mounted. The heat sink 200 further comprises a second side 206 that is opposite the first side 204. The second side 206 has a finned region 208 and a non-finned region 210. The finned region 208 comprises fins 212 on the second side 206 and valleys 214 between the fins 212. Though the fins 212 shown in FIG. 2A are all of the same height 216, it is to be appreciated that each of the fins 212 can have one or more heights 216 and/or varying heights 216 as well as varying thicknesses. The fins 212 provide additional surface area to facilitate cooling.

The one or more heat pipes 202 each have a length. If there are more than one heat pipe 202, the length of each heat pipe may vary from heat pipe to heat pipe. Alternatively, all or a subset of the heat pipes 202 may have identical lengths. At least one of the one or more heat pipes 202 have a first portion of its length that is in contact with the non-finned region 210 of the second side 206. In one aspect, the heat pipes 202 are affixed to the non-finned region 210 and/or the fins 212 by any method known to one of ordinary skill in the art including solder or thermally conductive epoxy, among other methods. Alternatively, at least a portion of the heat pipe 202 can be embedded in the base 218 of the heat sink 200 in the non-finned region 210. The heat pipes 202 run through the fins 212 of the heat sink 200. At least a second portion of the length of any heat pipe 202 that is in contact with or embedded within the non-finned region 210 of the second side 206 is at least partially embedded in the one or more heights 216 of the fins 212 of the finned region 208. The fins 212 can be milled or cast to accommodate the heat pipes 202. The heat pipes 202 can be in contact with some or all of the fins 212 and/or proximate to some or all of the fins 212. As can be seen in FIG. 2A, the second portion of the at least one heat pipe 202 embedded in the one or more heights 216 of the fins 212 of the finned region 208 is elevated away from the valleys 214 between the fins 212. Though not required, in some instances the at least one of the one or more heat pipes 202 are embedded in the heights 216 of the fins 212 such that the top of the heat pipe 202 is either flush with the height 216 of the highest fin 212 or lower than the height 216 of the highest fin 212. In other instances, at least one of the one or more heat pipes 202 may have a height that is higher than the height 216 of the highest fin 212.

The heat pipes 202 can have cross-sectional geometries of any shape. For example, any one of the heat pipes 202 may have cross-sectional geometries of circular, oval, square, rectangular, triangular, and the like. The cross-sectional geometry of any one heat pipe 202 may change along its length or stay the same.

Referring to FIG. 2B, the heat sink 200 can have a length 220 and a width 222. Though the heat sink of FIG. 2B is shown as rectangular, it is to be appreciated that the heat sink 202 can have any shape, including irregular shapes. It can be seen in FIG. 2B that the length of at least one of the one or more heat pipes 202 can extend at least partially across the length 220 of the heat sink 200. Likewise, it can be seen in FIG. 2B that the length of at least one of the one or more heat pipes 202 can extend at least partially across the width 222 of the heat sink 200. In FIG. 2C it can be seen that in some instances at least one of the one or more heat pipes 202 can extend beyond the length 220 of the heat sink 200. Likewise, in some instances, at least one of the one or more heat pipes 202 can extend beyond the width 222 of the heat sink 200.

Figure 3C:
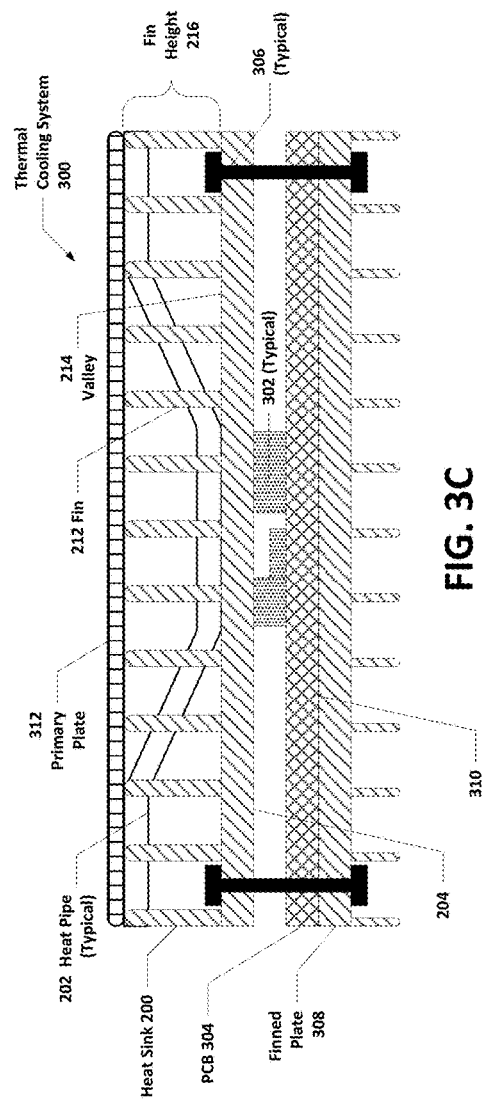

FIGS. 3A, 3B and 3C illustrate side or elevation views of embodiments of a thermal cooling system 300 that includes a heat sink 200. The heat sink 200 is at least partially comprised of thermally-conductive material, such as copper and/or aluminum or any other thermally-conductive material. For example, the heat sink 200 may be comprised of aluminum 6101. The heat sink 200 has a first side 204 that is in contact with or proximate to one or more heat-producing components such as components 302 shown in FIGS. 3A-3C that are mounted on a printed circuit board (PCB) 304. Though the PCB 304 shows components 302 on only one side, it is to be appreciated that components 302 may be located on one or both sides of the PCB 304 and the term "component" 302 is not to be limited to any one side of the PCB 304. The first side 204 of the heat sink 200 may be flat or smooth, or it may be milled or otherwise offset to accommodate the heat producing components and the size and/or shape of any board 304 on which the components are mounted. The heat sink 200 further comprises a second side 206 that is opposite the first side 204. The second side 206 has a finned region 208 and a non-finned region 210 (see FIGS. 2B and 2C). The finned region 208 comprises fins 212 on the second side 206 and valleys 214 between the fins 212. Though the fins 212 shown in FIGS. 3A, 3B and 3C are all of the same height 216, it is to be appreciated that each of the fins 212 can have one or more heights 216 and/or varying heights 216 as well as varying thicknesses. The fins 212 provide additional surface area to facilitate cooling. Generally, the heat producing components will be located proximate to the non-finned region 210 of the heat sink 200, though this is not required.

Further comprising the thermal cooling systems shown in FIGS. 3A, 3B and 3C are one or more heat pipes 202. The one or more heat pipes 202 each have a length. If there are more than one heat pipe 202, the length of each heat pipe may vary from heat pipe to heat pipe. Alternatively, all or a subset of the heat pipes 202 may have identical lengths. At least one of the one or more heat pipes 202 have a first portion of its length that is in contact with the non-finned region 210 of the second side 206. Alternatively, at least a portion of the heat pipe 202 can be embedded in the base 218 of the heat sink 200 in the non-finned region 210. The heat pipes 202 run through the fins 212 of the heat sink 200. At least a second portion of the length of any heat pipe 202 that is in contact with or embedded within the non-finned region 210 of the second side 206 is at least partially embedded in the one or more heights 216 of the fins 212 of the finned region 208. The fins 212 can be milled or cast to accommodate the heat pipes 202. The heat pipes 202 can be in contact with some or all of the fins 212 and/or proximate to some or all of the fins 212. As can be seen in FIGS. 3A, 3B and 3C, the second portion of the at least one heat pipe 202 embedded in the one or more heights 216 of the fins 212 of the finned region 208 is elevated away from the valleys 214 between the fins 212. Though not required, in some instances the at least one of the one or more heat pipes 202 are embedded in the heights 216 of the fins 212 such that the top of the heat pipe is either flush with the height 216 of the highest fin 212 or lower than the height 216 of the highest fin 212. In other instances, at least one of the one or more heat pipes 202 may have a height that is higher than the height 216 of the highest fin 212.

Each of the heat pipes 202 can have cross-sectional geometries of any shape. For example, the heat pipes 202 may have cross-sectional geometries of circular, oval, square, rectangular, triangular, and the like. The cross-sectional geometry of any one heat pipe 202 may change along its length or stay the same.

As shown in FIGS. 3A, 3B and 3C, the PCB 304 may be affixed 306 to the heat sink 200. For example, the heat sink 200 may be screwed, pinned, taped, glued, riveted, nailed or affixed by any other means to the PCB 304. In some instances, the PCB 304 and the heat sink 200 may be held in place by gravity and/or compression.

FIGS. 3B and 3C illustrate thermal cooling systems that include a (second) finned plate 308 in contact with or proximate to a second side 310 of the PCB 304. This finned plate 308 is comprised of thermally-conductive material such as aluminum and/or copper. In some instances, the finned plate 308 may also have one or more heat pipes embedded in its base and/or embedded in its fins. The length of at least one of the one or more heat pipes can extend at least partially across the length of the finned plate 308. Likewise, the length of at least one of the one or more heat pipes can extend at least partially across the width of the finned plate 308. In some instances at least one of the one or more heat pipes can extend beyond the length of the finned plate 308. Likewise, in some instances, at least one of the one or more heat pipes can extend beyond the width of the finned plate 308.

As shown in FIG. 3C, in some instances the thermal cooling system may further include a primary plate 312 that at least partially covers the fins 212 of the heat sink 200. The primary plate 312 can be affixed to the heat sink 200 in any known manner including screwed, pinned, taped, glued, riveted, nailed or affixed by any other means to the heat sink 200. For example, the primary plate 312 may be affixed to the heat sink 200 by solder or thermally conductive epoxy, among other methods. The primary plate 312 can be used to transfer heat from the fins 212 and/or the heat pipes 202, to protect the fins 212 from damage, to create channels for air flow through the fins 212, and to create a modular design for handling and installation. In some instances, at least a portion of the heat pipes 202 are flush with the top of the fins 212 such that the heat pipes 202 are in contact with the primary plate 312.

Figure 4:
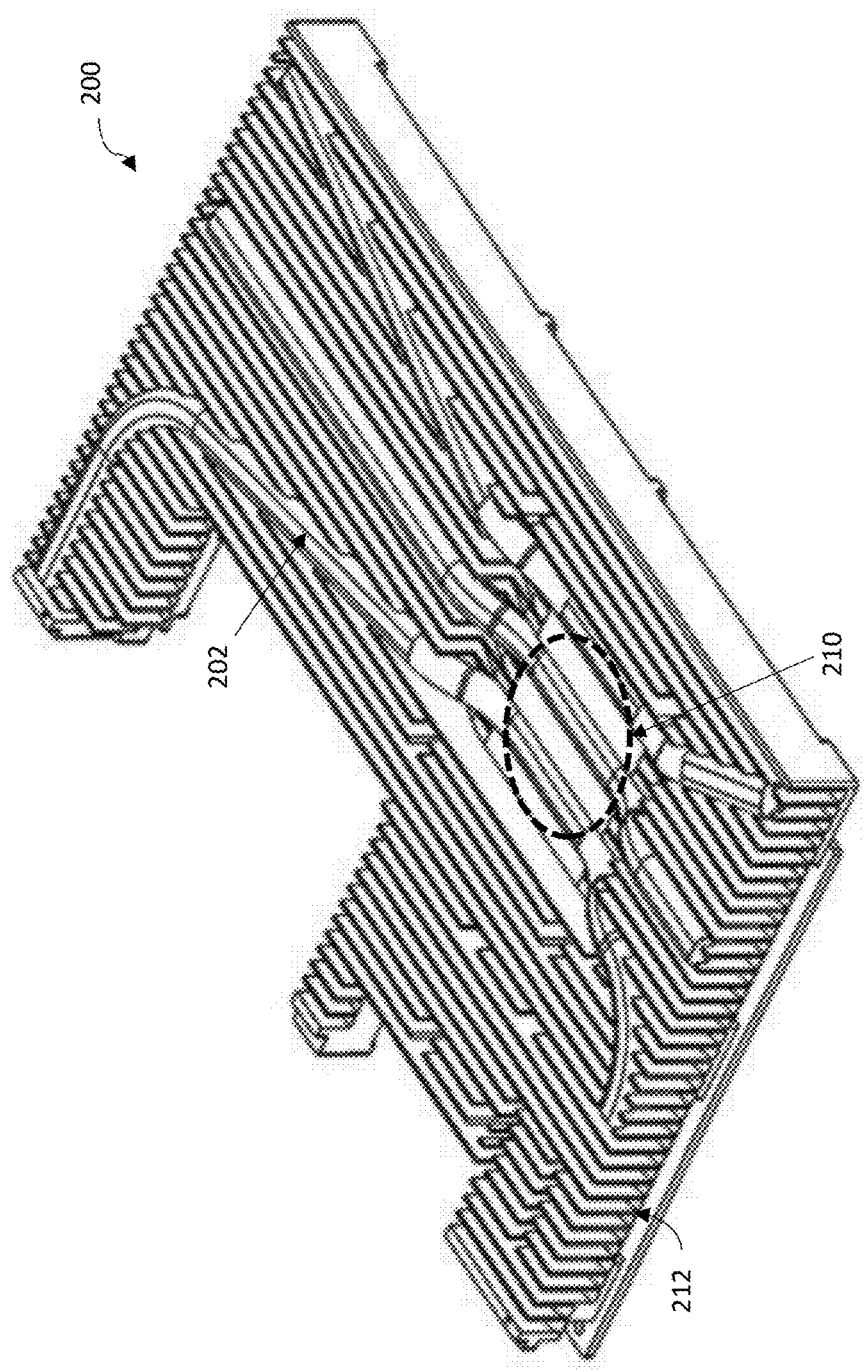
FIG. 4 illustrates an exemplary embodiment of a heat sink, with a primary plate removed for clarity, the heat sink having a finned region and a non-finned region.
Figure 5:
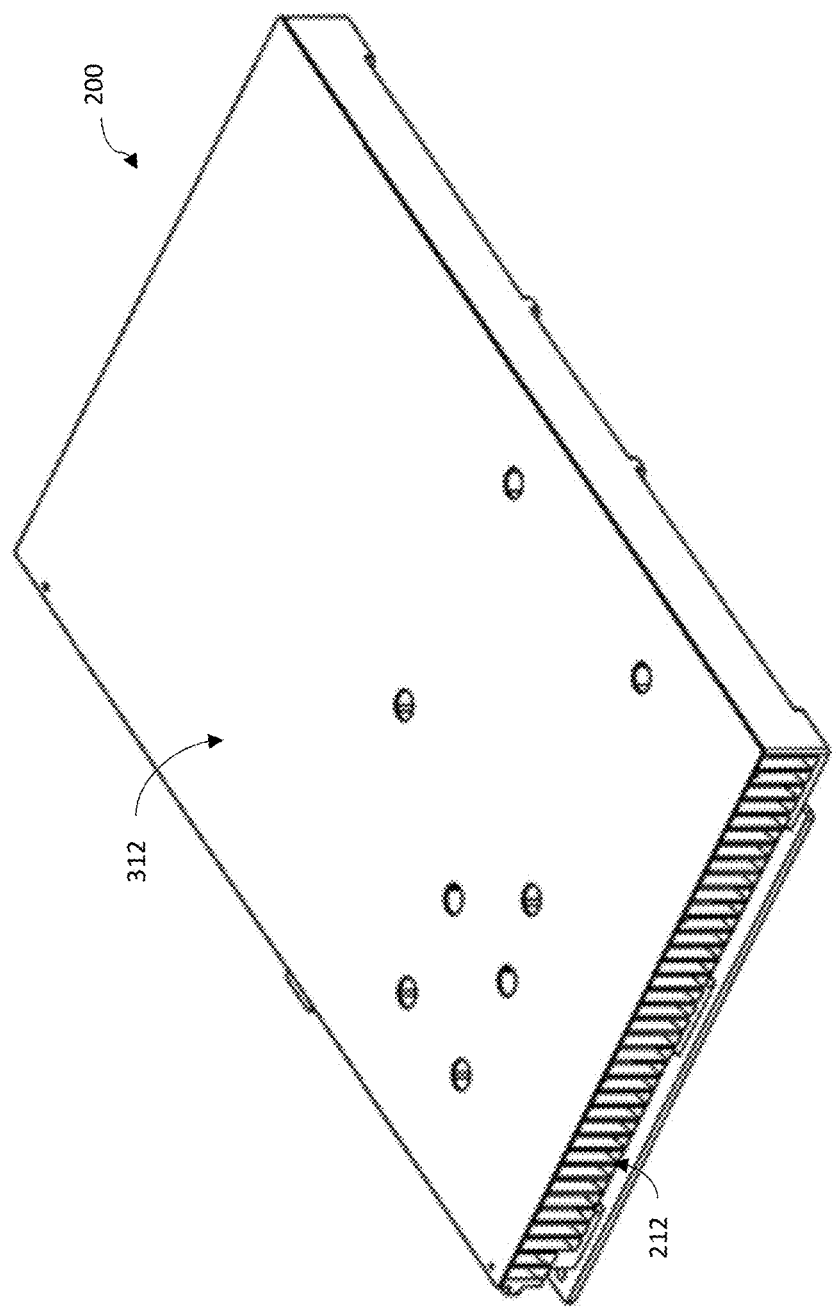
FIG. 5 illustrates the heat sink of FIG. 4 further comprising the primary plate that substantially covers the finned and non-finned regions of the heat sink.

FIG. 4 illustrates an exemplary embodiment of a heat sink 400 having a finned region 402 and a non-finned region 404. This illustration also shows the heat pipes 406 that are in contact with the non-finned region 404 and are embedded in the finned region 402. FIG. 5 illustrates the heat sink of FIG. 4 further comprising a primary plate 502 that substantially covers the finned 402 and non-finned 404 regions of the heat sink 400. As shown in FIG. 5, the primary plate 502 may include one or more holes or voids 504 for additional air flow and/or cooling, or for mounting purposes.

Laboratory testing of prototypes of the thermal cooling system described herein, including a primary plate, has shown an approximately 20 degrees Celsius temperature drop from hottest spot to coolest spot on the heat sink with an air inlet of 600 LFM at 75 degrees Celsius. This results in a pressure drop across the heat sink of approximately 200 pascals. Bench testing has allowed a 108 watt Ethernet switch to have a temperature rise of only approximately 28 degrees Celsius over ambient with 600 LFM air flowing across it, without heating adjacent components over their maximum operating temperatures. Using conventional heat pipes in the base of the heat sink, or not using heat pipes at all, would cause the 108 watt Ethernet switch to heat the adjacent components well out of their specified operating ranges.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A thermal sink comprising:
a heat sink at least partially comprised of thermally-conductive material, wherein the heat sink has a unitary, planar base portion comprising a first side that can be placed in contact with or proximate to one or more heat-producing components and a second side opposite the first side, said second side having a finned region and a non-finned region, said finned region with fins thereon and valleys between the fins, each fin having one or more heights;
one or more heat pipes each having a length, wherein at least one of the one or more heat pipes has at least a first portion of its length in contact with the non-finned region of the second side and at least a second portion of its length is at least partially embedded in the one or more heights of the fins of the finned region,
wherein the second portion of the at least one heat pipe embedded in the one or more heights of the fins of the finned region is elevated away from the valleys between the fins.

2. The thermal sink of claim 1, wherein the one or more heat pipes have a cross-section geometry consisting of one of circular, oval, square, rectangular, and triangular.

3. The thermal sink of claim 1, wherein the length of at least one of the one or more heat pipes extends at least partially across a length of the unitary, planar base portion of the heat sink.

4. The thermal sink of claim 1, wherein the length of at least one of the one or more heat pipes extends at least partially across a width of the unitary, planar base portion of the heat sink.

5. The thermal sink of claim 1, wherein the length of at least one of the one or more heat pipes extends beyond a length of the unitary, planar base portion of the heat sink.

6. The thermal sink of claim 1, wherein the length of at least one of the one or more heat pipes extends beyond a width of the unitary, planar base portion of the heat sink.

7. The thermal sink of claim 1, wherein the second portion of the at least one heat pipe embedded in the one or more heights of the fins of the finned region is in contact with one or more of the fins.

8. The thermal sink of claim 1, wherein the thermally-conductive material comprises aluminum 6101 or copper.

9. The thermal sink of claim 1, wherein the first portion of the length of the one or more heat pipes in contact with the non-finned region comprises the first portion at least partially embedded in the non-finned region of the heat sink.

10. The thermal sink of claim 1, wherein the one or more at least partially embedded in the one or more heights of the fins of the finned region comprises the heat pipes embedded in the one or more heights of the fins of the finned region such that a top of each of the heat pipes is flush with or below a top of the fins.

11. A thermal cooling system comprising:
- a heat sink, wherein the heat sink is at least partially comprised of thermally-conductive material, wherein the heat sink has a unitary, planar base portion comprising a first side and a second side opposite the first side, said second side having a finned region and a non-finned region, said finned region with fins thereon and valleys between the fins, each fin having one or more heights; and
- said heat sink further comprising one or more heat pipes each having a length, wherein at least one of the one or more heat pipes has at least a first portion of its length in contact with the non-finned region of the second side and at least a second portion of its length is at least partially embedded in the one or more heights of the fins of the finned region, wherein the second portion of the at least one heat pipe embedded in the one or more heights of the fins of the finned region is elevated away from the valleys between the fins;
- a primary plate that at least partially covers and contacts the fins of the heat sink;
- a printed circuit board (PCB) with one or more heat producing components on a first side of the PCB, wherein the first side of the heat sink is in contact with or proximate to at least one of the one or more heat producing components of the PCB; and
- a finned plate in contact with or proximate to a second side of the PCB.

12. The thermal cooling system of claim 11, wherein the one or more heat pipes have a cross-section geometry consisting of one of circular, oval, square, rectangular, and triangular.

13. The thermal cooling system of claim 11, wherein the length of at least one of the one or more heat pipes extends at least partially across a length of the unitary, planar base portion of the heat sink.

14. The thermal cooling system of claim 11, wherein the length of at least one of the one or more heat pipes extends at least partially across a width of the unitary, planar base portion of the heat sink.

15. The thermal cooling system of claim 11, wherein the length of at least one of the one or more heat pipes extends beyond a length of the unitary, planar base portion of the heat sink.

16. The thermal cooling system of claim 11, wherein the length of at least one of the one or more heat pipes extends beyond a width of the unitary, planar base portion of the heat sink.

17. The thermal cooling system of claim 11, wherein the second portion of the at least one heat pipe embedded in the one or more heights of the fins of the finned region is in contact with one or more of the fins.

18. The thermal cooling system of claim 11, wherein the thermally-conductive material comprises aluminum 6101 or copper.

19. The thermal cooling system of claim 11, wherein the first portion of the length of the one or more heat pipes in contact with the non-finned region comprises the first portion at least partially embedded in the non-finned region of the heat sink.

20. The thermal cooling system of claim 11, wherein the one or more at least partially embedded in the one or more heights of the fins of the finned region comprises the heat pipes embedded in the one or more heights of the fins of the finned region such that a top of each of the heat pipes is flush with or below a top of the fins.

* * * * *